United States Patent
Jeon et al.

(10) Patent No.: US 8,683,297 B2
(45) Date of Patent: Mar. 25, 2014

(54) SYSTEMS AND METHODS OF GENERATING A REPLACEMENT DEFAULT READ THRESHOLD

(75) Inventors: Seungjune Jeon, Milpitas, CA (US); Steven Cheng, Milpitas, CA (US)

(73) Assignee: SanDisk Technologies Inc., Plano, TX (US)

( * ) Notice: Subject to any disclaimer, the term of this patent is extended or adjusted under 35 U.S.C. 154(b) by 310 days.

(21) Appl. No.: 13/287,299

(22) Filed: Nov. 2, 2011

(65) Prior Publication Data

US 2013/0111279 A1    May 2, 2013

(51) Int. Cl.
*G11C 29/00*    (2006.01)

(52) U.S. Cl.
USPC .......................................... 714/769; 714/702

(58) Field of Classification Search
USPC ........... 365/185.02, 185.03, 185.24; 714/763, 714/770, 769, 702
See application file for complete search history.

(56) References Cited

U.S. PATENT DOCUMENTS

| | | | |
|---|---|---|---|
| 7,630,240 B2 * | 12/2009 | Roohparvar | 365/185.03 |
| 7,849,383 B2 * | 12/2010 | Lin | 714/763 |
| 7,876,621 B2 | 1/2011 | Sharon et al. | |
| 7,903,468 B2 | 3/2011 | Litsyn et al. | |
| 8,125,833 B2 * | 2/2012 | Sharon et al. | 365/185.24 |
| 8,259,506 B1 * | 9/2012 | Sommer et al. | 365/185.24 |
| 8,374,026 B2 * | 2/2013 | Sharon et al. | 365/185.02 |
| 2009/0199074 A1 | 8/2009 | Sommer | |
| 2009/0319868 A1 | 12/2009 | Sharon et al. | |
| 2010/0192042 A1 | 7/2010 | Sharon et al. | |

FOREIGN PATENT DOCUMENTS

WO    2011146685 A2    11/2011

OTHER PUBLICATIONS

The International Search Report and Written Opinion mailed Feb. 8, 2013 in International Application No. PCT/US2012/061811, 11 pages.

* cited by examiner

*Primary Examiner* — David Ton
(74) *Attorney, Agent, or Firm* — Toler Law Group, PC

(57) ABSTRACT

A method includes generating a replacement default read threshold at least partially based on a default read threshold and on an updated read threshold. The method also includes sending the replacement default read threshold to the memory.

26 Claims, 6 Drawing Sheets

SYSTEMS AND METHODS OF GENERATING A REPLACEMENT DEFAULT READ THRESHOLD

FIELD OF THE DISCLOSURE

The present disclosure is generally related to updating default read thresholds in memory systems.

BACKGROUND

Non-volatile memory devices, such as universal serial bus (USB) flash memory devices or removable storage cards have allowed for increased portability of data and software applications. Flash memory devices can increase data storage density by storing multiple bits in each flash memory cell. For example, Multi-Level Cell (MLC) flash memory devices provide increased storage density by storing 3 bits per cell, 4 bits per cell, or more.

Storing multiple bits of information in a single flash memory cell typically includes mapping sequences of bits to states of the flash memory cell. For example, a first sequence of bits "110" may correspond to a first state of a flash memory cell and a second sequence of bits "010" may correspond to a second state of the flash memory cell. After determining that a sequence of bits is to be stored into a particular flash memory cell, the flash memory cell may be programmed to a state corresponding to the sequence of bits.

Once memory cells in the memory device have been programmed, data may be read from the memory cells by sensing the programming state of the memory cells by comparing cell threshold voltages to one or more read thresholds. However, sensed programming states can sometimes vary from the written programming states due to one or more factors, such as data retention and program disturb conditions. Read thresholds can be updated to reduce a number of data errors resulting from sensed programming states that do not match written programming states. However, read thresholds that are selected to reduce errors in one portion of a memory may cause an increase in errors when reading data from another portion of the memory

SUMMARY

Generation of a replacement default read threshold at least partially based on a default read threshold and on an updated read threshold can enhance error correction capability in multi-level-cell (MLC) NAND Flash memory systems. For example, improved error correction capability may be achieved by generating a replacement default read threshold based on a weighted average of the default read threshold and the updated read threshold as compared to using the updated read threshold only.

DETAILED DESCRIPTION

Decoding techniques that provide updated read thresholds to reduce overall access errors of data stored across an entire memory as the memory ages may provide improved performance as data storage device dimensions decrease and as storage densities increase. Generation of a replacement default read threshold at least partially based on a default read threshold and on an updated read threshold can enhance error correction capability in multi-level-cell (MLC) NAND Flash memory systems as compared to using the updated read threshold only.

Systems and methods of generating a replacement default read threshold read data from a memory in a data storage device using a default read threshold. In response to encountering an error correction coding operation failure associated with data read from the memory using the default read threshold, the data is read from the memory using an updated read threshold. A replacement default read threshold at least partially based on the default read threshold and on the updated read threshold is generated. The replacement default read threshold is sent to the memory for use in subsequent read operations.

Figure 1:
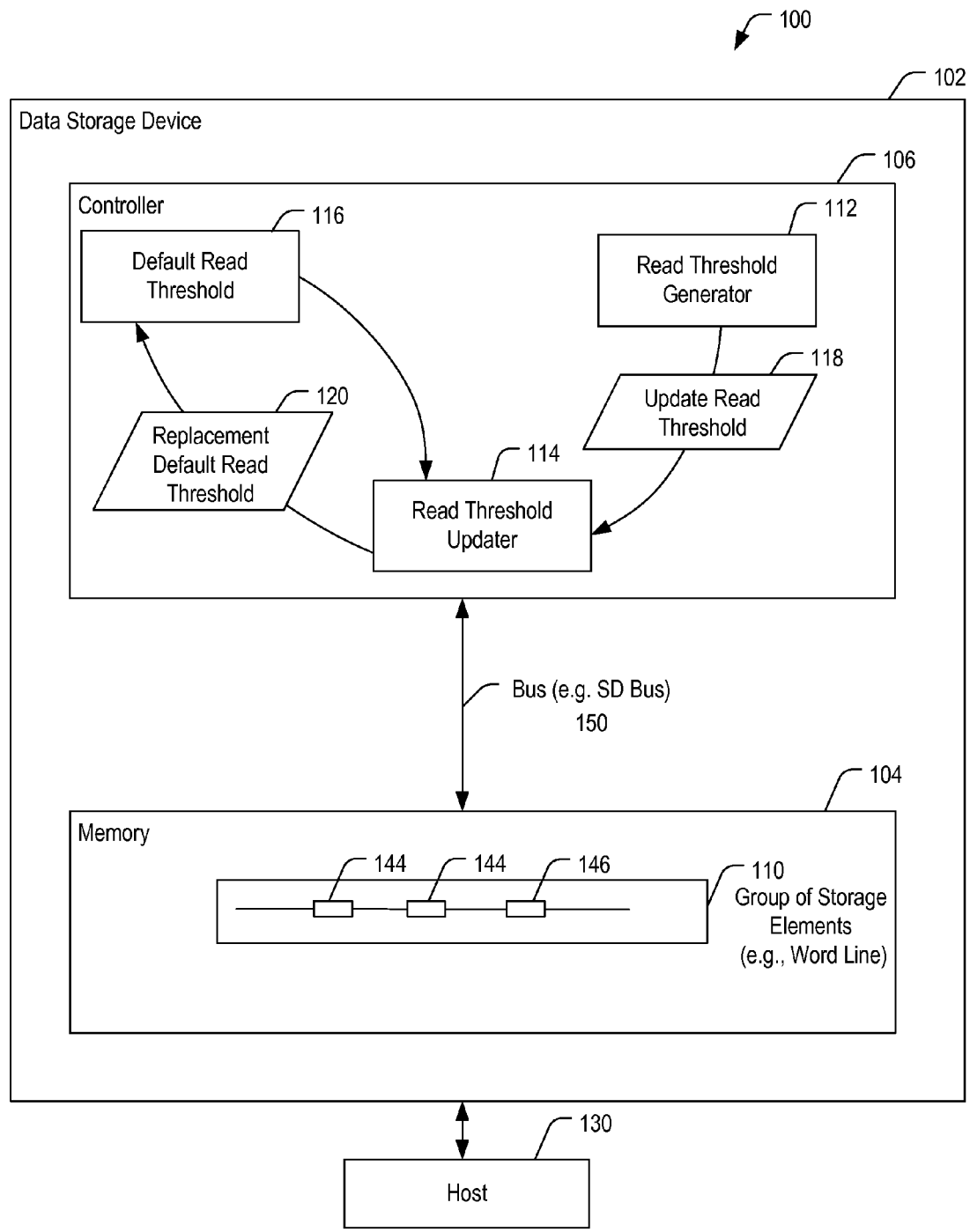
FIG. 1 is a block diagram of a first illustrative embodiment of a system to generate a replacement default read threshold of a memory.

Referring to FIG. 1, a particular illustrative embodiment of a system to generate a replacement default read threshold is depicted and generally designated 100. The system 100 includes a data storage device 102 coupled to a host device 130. The data storage device 102 includes a controller 106 coupled to a memory 104 via a bus 150. For example, the bus 150 may be a Secure Digital (SD) bus.

The data storage device 102 may be a memory card, such as a Secure Digital SD® card, a microSD® card, a miniSD™ card (trademarks of SD-3C LLC, Wilmington, Del.), a MultiMediaCard™ (MMC™) card (trademark of JEDEC Solid State Technology Association, Arlington, Va.), or a CompactFlash® (CF) card (trademark of SanDisk Corporation, Milpitas, Calif.). As another example, the data storage device 102 may be embedded memory in the host device 130, such as eMMC® (trademark of JEDEC Solid State Technology Association, Arlington, Va.) and eSD memory, as illustrative examples.

The controller 106 is configured to read data from a group of storage elements 110 of the memory 104 using a default read threshold 116. The controller 106, upon determining a number of errors in the data read from the group of storage elements 110 that exceed a threshold, is configured to generate a replacement default read threshold 120 at least partially based on the default read threshold 116 and on an update read threshold 118. By generating the replacement default read threshold 120 based on the default read threshold 116 and the update read threshold 118, subsequent reads of data from the memory 104 may be performed according to a threshold voltage that may converge to a value that reduces an overall number of errors in data read from the memory 104, such as described with respect to FIG. 2.

The controller 106 includes a read threshold generator 112 and a read threshold updater 114. The read threshold generator 112 is configured to generate the update read threshold 118 in response to detection of too many errors in the read data corresponding to the representative group of storage elements 110, such as an error correction coding (ECC) operation failure while decoding the read data. The read threshold generator 112 may generate the update read threshold 118 to reduce errors in the data read from the group of storage elements 110. However, the update read threshold 118 may be generated without consideration of characteristics of other groups of storage elements in the memory 104. As a result, the update read threshold 118 may be an optimal or near-optimal set of read threshold voltages to reduce errors of data read from the illustrated group of storage elements 110. However, the update read threshold 118 may result in additional errors introduced to data read from other portions of the memory 104.

The read threshold updater 114 is configured to receive the update read threshold 118 and the default read threshold 116 and to perform one or more operations to determine the replacement default read threshold 120. For example, the read threshold updater 114 may generate the replacement default read threshold 120 according to a weighted average of the update read threshold 118 and the default read threshold 116. As explained in further detail with respect to FIG. 2, as the memory 104 ages, a read threshold that may reduce the total number of errors that occurs during a data read from the memory 104 may converge to a mean voltage according to each group of storage elements 110 having individual read characteristics. By generating the replacement default read threshold 120 using a combination of the update read threshold 118 and the default read threshold 116, the read threshold updater 114 may generate the replacement default read threshold 120 to approach a long-term average threshold voltage that may cause fewest total errors when used to read the entire memory 104.

The memory 104 may be a non-volatile memory array of a flash device, such as a NAND flash device, a NOR flash device, or any other type of flash device. For example, the group of storage elements 110 may be a word line of a NAND flash memory device. To illustrate, the group of storage elements 110 may include multiple storage elements, such as representative storage elements 142, 144, and 146 of a word line of a flash memory device. Each storage element 142-146 may have a threshold voltage corresponding to a state of data stored at the storage element 142-146. For example, each storage element 142-146 may be programmed to have one of multiple predefined states. Each of the predefined states may be mapped to a particular bit value. The data stored at the storage element 142-146 may be read by comparing the threshold voltage to the default read threshold 116. Data read from the memory 104 may be transferred to the controller 106 via the bus 150.

The host device 130 may be configured to provide data to be stored at the memory 104 or to request data to be read from the memory 104. For example, the host device 130 may include a mobile telephone, a music or video player, a gaming console, an electronic book reader, a personal digital assistant (PDA), a computer such as a laptop computer, a notebook computer or a tablet, any other electronic device, or any combination thereof.

During operation, the host device 130 may instruct the controller 106 to retrieve data corresponding to the group of storage elements 110, such as the storage elements 142-146, from the memory 104. The controller 106 may indicate to the memory 104 the default read threshold 116 to be used by the memory 104 to read the data. In response to determining that a number of errors in the data read from the storage elements 142-146 exceeds a threshold, the controller 106 may generate the update read threshold 118 based on characteristics of the group of storage elements 110 so that reading the group of storage elements 110 with the update read threshold 118 will generate fewer errors than resulted from reading the group of storage elements 110 using the default read threshold 116. The controller 106 may also generate the replacement default read threshold 120 at least partially based on the default read threshold 116 and on the updated read threshold 118. For example, the read threshold generator 112 may generate the update read threshold 118. The read threshold updater 114 may receive the update read threshold 118 and the default read threshold 116 and perform one or more operations, such as a weighted sum of the update read threshold 118 and the default read threshold 116, to generate the replacement default read threshold 120.

By generating the replacement default read threshold 120 based on the default read threshold 116 and the update read threshold 118, subsequent reads of data from the memory 104 may be performed according to a threshold voltage that may converge to a value that reduces an overall number of errors in data read from the memory 104 without substantially deviating from a convergence value as a result of outlying values of the update read threshold 118.

Figure 2:
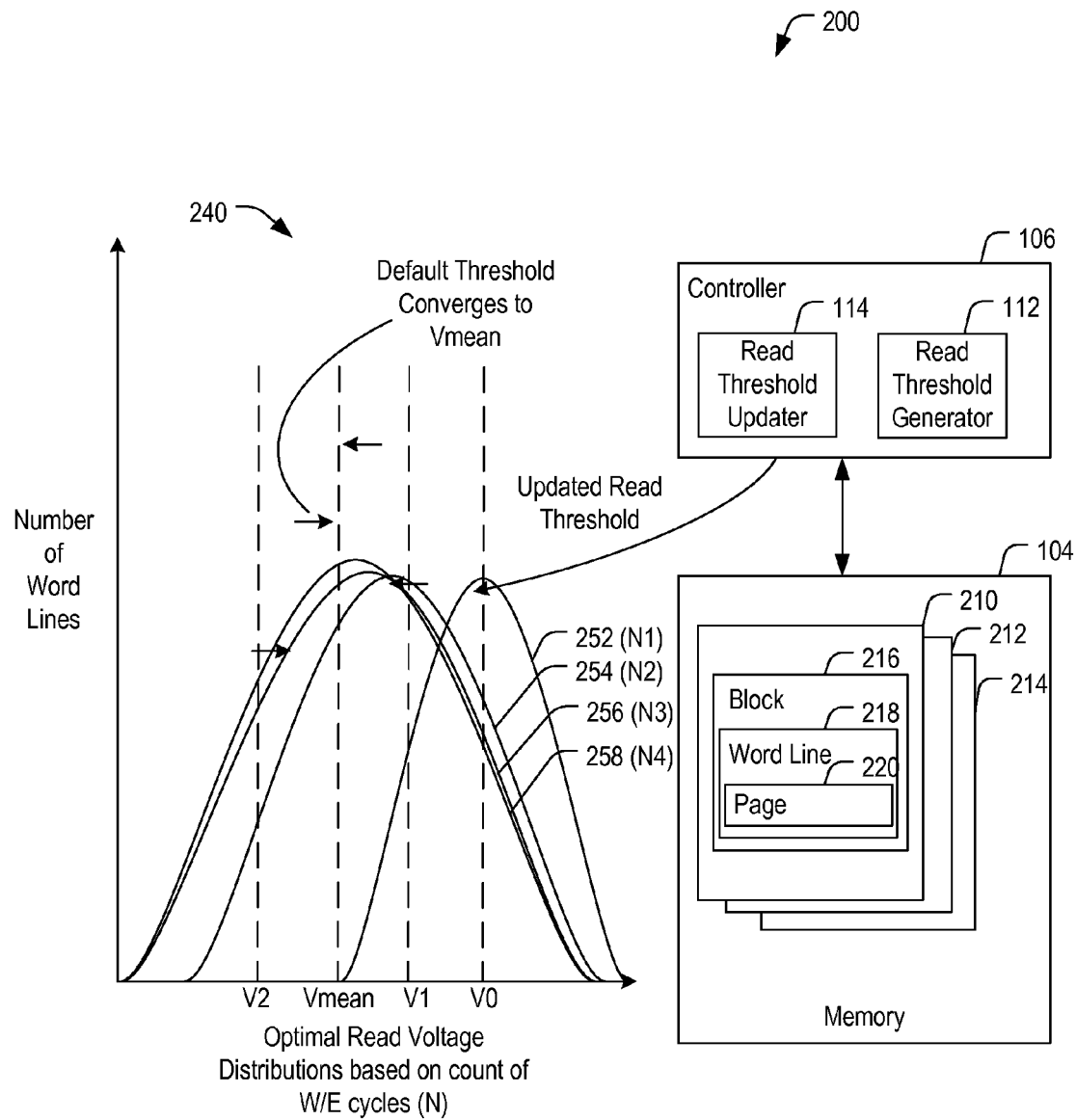
FIG. 2 is a diagram illustrating an example of read thresholds and read voltage distributions that may be exhibited by the memory of FIG. 1.

Referring to FIG. 2, a diagram illustrating an example of read voltage distributions that may be exhibited by the memory 104 of FIG. 1 is depicted and generally designated 200. As illustrated, the memory 104 may include one or more dies, such as a first die 210, a second die 212, and a third die 214. Each of the one or more dies 210-214 may include multiple blocks, such as a representative block 216. For example, each block may be an erase block of a NAND flash memory. Each block may include one or more word lines, such as a representative word line 218. Each word line may include one or more pages, such as a representative page 220. The page 220 may represent a smallest writable unit of data to the memory 104. A chart 240 illustrates read voltage distributions based on an amount or number of write/erase cycles (W/E cycles). For example, a first read voltage distribution 252 relates a threshold voltage on the horizontal access with a number of word lines corresponding to that threshold voltage on a vertical access. The first read voltage distribution 252 may illustrate a distribution of "optimal" read thresholds of each of the word lines 218 of the memory 104. For example, the first read voltage distribution 252 has a peak at a voltage labeled V0. As a result, by using the voltage V0 as a read voltage, a largest number of word lines in the memory 104 may be read at their optimal read voltage. Similarly, as the voltage increases from V0 or decreases from V0, a number of word lines corresponding to that voltage as an optimal read voltage decreases. The read voltage may be determined as "optimal" by performing multiple reads of each segment of the memory 104, such as each word line 218, using different read voltages and determining a fewest number of detected errors in data read from each segment of the memory 104 according to each of the read voltages. The voltage that results in the fewest detected errors in reading an individual word line may be considered the "optimal" read voltage for that word line.

As illustrated, the first read voltage distribution 252 is relatively narrow as compared to a second read voltage distribution 254, a third read voltage distribution 256, and a fourth read voltage distribution 258. The read voltage distributions 252-258 illustrate a representative aging of the memory 104 according to the number of write/erase cycles of the memory 104. For example, the number N of write/erase cycles for the first read voltage distribution 252 may be a number N1, such as ten write/erase cycles, while the second read voltage distribution 254 may correspond to a larger number of write/erase cycles (N2), such as 500 write/erase cycles. The third read voltage distribution 256 may correspond to a third number of write/erase cycles N3 that is larger than N2, and the fourth read voltage distribution 258 may correspond to a fourth number of write/erase cycles N4 that is larger than N3. As the count of write/erase cycles increases, a mean of each of the distributions 252-258 decreases from V0 and approaches a value labeled as Vmean. Further, as N increases, a width of the read voltage distributions 252-258 increases.

As a result of the behavior illustrated in the graph 240, it can be seen that for a distribution of "optimal" read voltages, the mean of the distribution decreases relatively rapidly with small increments of N when N is small (e.g., N=0), and converges to a value Vmean after a relatively small number of write/erase cycles, such as 500 write/erase cycles. Therefore, changes in read thresholds for relatively young memories (i.e., low number of write/erase cycles) may be primarily caused by the shift in the "optimal" mean voltage from V0 toward Vmean. However, after the count of write/erase cycles has met or exceeded N2, a broadening of the distribution from a highest value to a lowest value may cause more errors than relatively small movement of the "optimal" mean with respect to increasing N.

When a new or updated read threshold is needed (i.e., in response to a detection of too many errors in the read data), the read threshold generator 112 may generate the updated read threshold by modeling a cell voltage distribution (CVD) to locate updated read voltages based on the modeled CVD or by initiating a dynamic read to perform multiple read operations at different read voltages to determine a read voltage resulting in fewest errors. In order to reuse the updated read threshold for future read operations within a predefined group of cells, the updated read threshold is stored. Because the read threshold generator 112 may generate an updated read threshold in response to detecting errors within a single word line 218 of the memory 104, the read threshold generator 112 may generate a value that represents an outlying value of a read voltage distribution, which may be far from a mean value of the distribution. For example, the update value may be at a "tail" of the distribution rather than at a center, although the center represents the most appropriate value for reduced errors across the entire memory 104. To illustrate, during an operation of the read threshold generator 112, an updated read threshold may be determined to be toward the right edge of the fourth read voltage distribution 258 (e.g. a voltage greater than V0). However, such a read threshold voltage, if used as the default read threshold voltage for the entire memory 104, would result in sub-optimal performance of most of the memory 104 and represents a significant deviation from an optimal read voltage for word lines corresponding to a left edge in the fourth read voltage distribution 258 (i.e., word lines with optimal voltages less than V2). In this case, after updating the default read voltage for the memory with a voltage greater than V0, a word line that represents a position on the far left of the fourth read voltage distribution 258 is likely to experience a larger number of errors (due to having an optimal read voltage that is farthest from the updated read voltage), and may be a next word line that is detected to have a number of errors exceeding a threshold. The read threshold generator 112 may generate a next updated read threshold based on the word line corresponding to the leftmost voltage of the fourth read voltage distribution 258. As a result, the updated read thresholds that are generated by the read threshold generator 112 may experience a "ping-pong" behavior, as the read threshold voltages are generated based on optimal voltages for the leftmost (or rightmost) word lines of a given distribution, resulting in increased errors for the rightmost (or leftmost) word lines of the distribution.

To counteract such a "ping-pong" effect of the read threshold generator 112, the read threshold updater 114 may apply a filtering mechanism that causes a default read threshold for the entire memory 104 to converge toward a voltage Vmean. For example, the read threshold updater 114 may apply a weighted sum of the default read threshold with a most recent updated read threshold generated by the read threshold generator 112. As the read threshold generator 112 generates a first sequential update read threshold, illustrated as V0, a second sequential update read threshold, illustrated as V1, and a third sequential update read threshold, illustrated as V2, the read threshold updater 114 may decrease a weight given to the update read threshold as it increases from V0 to V2 to cause a convergence toward the Vmean. As a result, subsequent reads of data from the memory 104 may be performed according to a threshold voltage that may converge to a value that reduces an overall number of errors in data read from the memory 104 without substantially deviating from a convergence value as a result of outlying values of the update read threshold.

For example, the read threshold updater 114 may apply a weighted sum to compute a replacement default read threshold according to the equation:

$$(T*\text{New Threshold})+N*(1-T)*\text{Default Threshold}/(N+1)$$

$$\text{or } (T*\text{New Threshold})+(1-T)*\text{Default Threshold}$$

where:
Default Threshold="Default Read Threshold" (e.g., 116)
New Threshold="Update Read Threshold" (e.g., 118)
N=Count of Prior Updates to Default Read Threshold
T=Scaling Factor; where $0 \le T \le 1$ The weighted sum may be at least partially based on a count of prior updates to the default read threshold 116. For example, the weighted sum may be at least partially based on the count N of prior updates to the default read threshold 116. As another example, the weighted sum may be at least partially based on a moving average, where the moving average is based on prior updates to the default read threshold 116. For example, a history of default read threshold values may be used to determine the moving average. As another example, the weighted sum may be at least partially based on the updated read threshold 118 scaled by a first scaling factor and the default read threshold 116 scaled by a second scaling factor. For example, the first scaling factor may be the scaling factor "T" and the second scaling factor may be (1−T). The sum of the first scaling factor and the second scaling factor may equal one. The scaling factor T may be based on experimental data or measurement, cycling information of the memory, differences in dies, differences in logical groups (i.e., page; word line, etc.), or other factors.

In other embodiments, the read threshold updater 114 may generate the replacement default read threshold 120 based on the default read threshold 116 and the update read threshold 118 according to other combinations of the default read threshold 116 and the update read threshold 118. For example, the replacement default read threshold 120 may be generated based on a geometric mean, a weighted mean, or one or more other combinations of the default read threshold 116 and the update read threshold 118.

Figure 3:
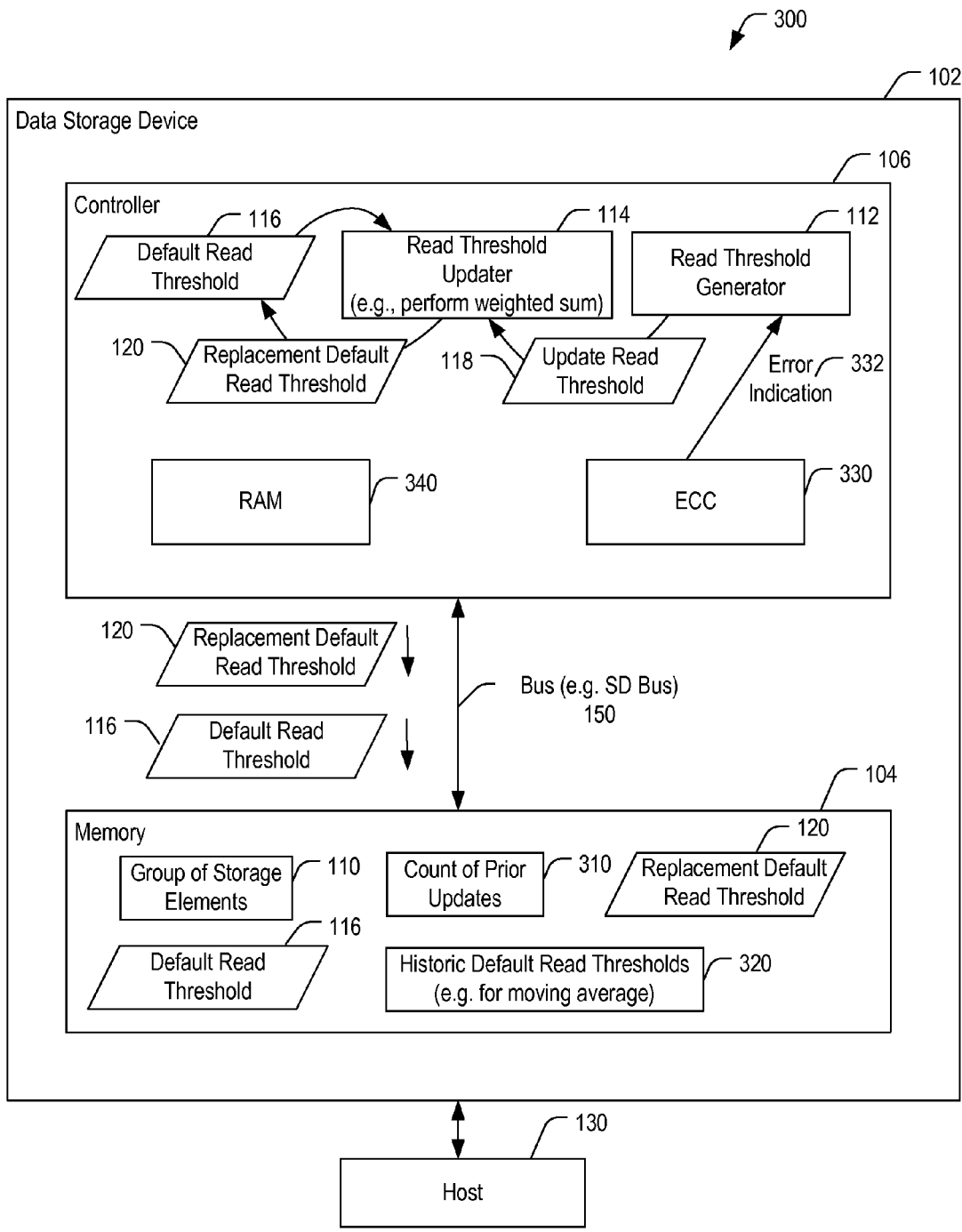
FIG. 3 is a block diagram of a second illustrative embodiment of a system to generate a replacement default read threshold.

Referring to FIG. 3, a second illustrative embodiment of a system to generate a replacement default read threshold is depicted and generally designated 300. The system 300 includes the data storage device 102 coupled to the host device 130. The data storage device 102 includes the controller 106 coupled to the memory 104 via the bus 150. An output of the data storage device 102 may be provided to the host device 130 while the data storage device 102 is operatively coupled to the host device 130.

The controller 106 is configured to read data from the group of storage elements 110 of the memory 104 using the default read threshold 116. The controller 106, upon determining that a number of errors in the data read from the group of storage elements 110 exceeds a threshold, is configured to generate the replacement default read threshold 120 at least partially based on the default read threshold 116 and on the updated read threshold 118.

The controller 106 includes the read threshold generator 112 and the read threshold updater 114. The read threshold generator 112 is configured to generate the update read threshold 118 in response to a detection of too many errors in the read data corresponding to the representative group of storage elements 110, such as an error correction code (ECC) operation failure while decoding the read data. For example, an ECC engine 330 may be configured to detect errors in the read data corresponding to the representative group of storage elements 110. The controller 106 may be configured to provide the read data to the ECC engine 330. The ECC engine 330 may provide an error indication 332 to the read threshold generator 112 based on decoded data resulting from ECC processing at the ECC engine 330. The read threshold generator 112 may generate the update read threshold 118 to provide an improvement of read threshold voltages to reduce errors in the data read from the group of storage elements 110.

The read threshold updater 114 may receive the update read threshold 118 and the default read threshold 116 and perform one or more operations, such as a weighted sum of the update read threshold 118 and the default read threshold 116, to generate the replacement default read threshold 120.

The controller 106 may include a random access memory (RAM) 340. The RAM 340 is configured to store the default read threshold 116, the update read threshold 118, the replacement default read threshold 120, or any combination thereof Alternatively, or in addition, the memory 104 may store the default read threshold 116, the update read threshold 118, the replacement default read threshold 120, or any combination thereof.

The memory 104 may include the group of storage elements 110, a count of prior updates 310, and historic default read thresholds 320. The count of prior updates 310 may include a count of prior updates that have been applied to the default read threshold 116. The historic default read thresholds 320 may include previous values of the default read threshold 116. A moving average of the default read threshold 116 may be determined by reading the number of prior updates to the default read threshold 116 and the previous values of the default read threshold 116.

During operation, the host device 130 may instruct the controller 106 to retrieve data corresponding to the group of storage elements 110. The controller 106 may indicate to the memory 104 the default read threshold 116 to be used by the memory 104 to read the data. The ECC engine 330 may detect errors in the read data corresponding to the representative group of storage elements 110. The ECC engine 330 may provide an error indication 332 to the read threshold generator 112 based on decoded data resulting from ECC processing at the ECC engine 330. The read threshold generator 112 may generate the update read threshold 118 to provide an improvement of read threshold voltages to reduce errors in the data read from the group of storage elements 110. In response to determining that a number of errors in the data read from the group storage elements 110 exceeds a threshold, the controller 106 may generate the replacement default read threshold 120 at least partially based on the default read threshold 116 and on the updated read threshold 118.

For example, the read threshold generator 112 may generate the update read threshold 118. The read threshold updater 114 may receive the update read threshold 118 and the default read threshold 116 and perform one or more operations, such as a weighted sum of the update read threshold 118 and the default read threshold 116, to generate the replacement default read threshold 120. As an example, the weighted sum may be at least partially based on the count of prior updates 310 to the default read threshold. As another example, the weighted sum may be at least partially based on a moving average, where the moving average is based on prior updates to the default read threshold. For example, the prior updates to the default read threshold may be retrieved from the historic default read thresholds module 320. Subsequent reads of data from the memory 104 may be performed according to a threshold voltage that may converge to a value that reduces an overall number of errors in data read from the memory 104.

Figure 4:
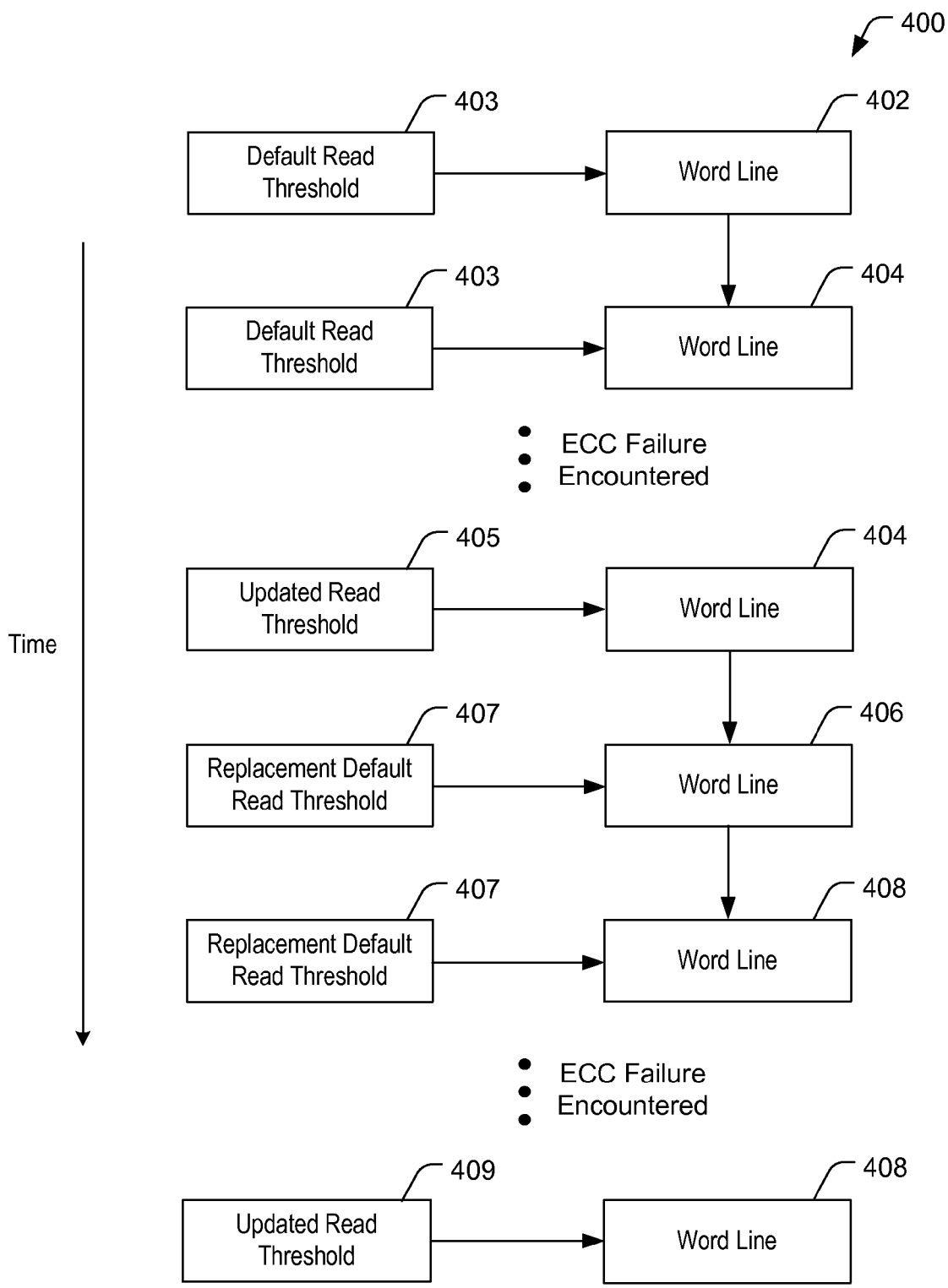
FIG. 4 is a block diagram illustrating an example of reading data from a memory using a default read threshold, and in response to encountering an error correction coding operation failure associated with the data read from the memory using the default read threshold, performing a subsequent read of the memory using the replacement read threshold after reading the data from the memory using an updated read threshold.

Referring to FIG. 4, a diagram illustrating an example of reading data from a memory using a default read threshold, and in response to encountering an error correction coding operation failure associated with the data read from the memory using the default read threshold, performing a subsequent read of the memory using the replacement read threshold after reading the data from the memory using an updated read threshold, is depicted and generally designated 400. As illustrated, data from representative word lines 402, 404, 406, and 408 of a memory, such as the memory 104, may be read using various read thresholds 403, 405, 407, and 409. For example, a first word line 402 may be read using a default read threshold 403 and a second word line 404 may be read using the default read threshold 403. To illustrate, the controller 106 may indicate to the memory 104 the default read threshold 403 to be used by the memory 104 to read the data in the first word line 402 and the second word line 404.

In response to encountering an error correction coding (ECC) operation failure corresponding to the second word line 404, where the ECC operation failure is associated with the data read from the second word line 404 using the default read threshold 403 (i.e., too many errors in the read data), the second word line 404 may be read using an updated read threshold 405. For example, the read threshold generator 112 may generate the updated read threshold 405 used to read the second word line 404.

After reading the second word line 404 using the updated read threshold 405, a subsequent read of data from the memory 104 may be performed according to a threshold voltage that may converge toward a value that reduces an overall number of errors in data read from the memory 104. To illustrate, a third word line 406 may be read by a replacement default read threshold 407. The replacement default read threshold 407 may be generated by the read threshold updater 114, which may receive the updated read threshold 405 and the default read threshold 403 and may perform one or more operations, such as a weighted average of the updated read threshold 405 and the default read threshold 403, to generate the replacement default read threshold 407. Subsequent reads of data from the memory 104 may be performed using the replacement default read threshold 407 until a second ECC operation failure occurs.

For example, a fourth word line 408 may be read using the replacement default read threshold 407. In response to encountering the second ECC operation failure, where the second ECC operation failure is associated with the data read from the fourth word line 408 using the replacement default read threshold 407, the fourth word line 408 may be read using another updated read threshold 409. Subsequent reads of data from the memory may be performed using replacement default read thresholds that are generated to converge toward a mean value, such as Vmean of FIG. 2.

Figure 5:
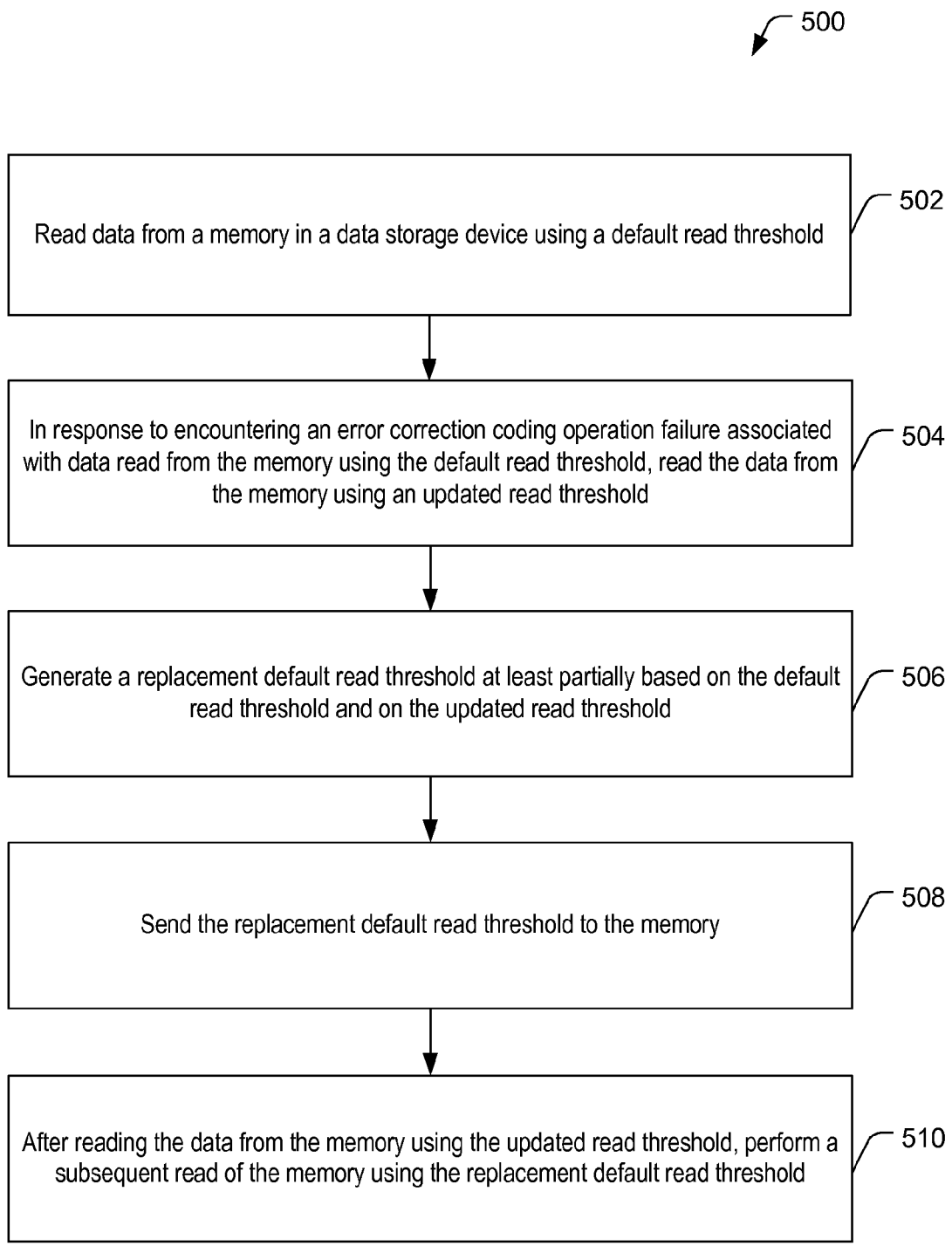
FIG. 5 is a flow diagram illustrating a particular embodiment of a method of generating a replacement default read threshold.

Referring to FIG. 5, a flowchart that illustrates an embodiment of a method of generating a replacement default read threshold is depicted and generally designated 500. The method 500 may be performed in a controller of a data storage device. The data storage device may include a memory. For example, the method may be performed in the data storage device 102 of FIG. 1 and FIG. 3.

Data is read from a memory in a data storage device using a default read threshold, at 502. For example, the controller 106 may be configured to read data from the group of storage elements 110 of the memory 104 using the default read threshold 116.

In response to encountering an error correction coding operation failure associated with the data read from the memory using the default read threshold, the data is read from the memory using an updated read threshold, at 504. For example, the read threshold generator 112 may generate the update read threshold 118 in response to a detection of too many errors in the read data corresponding to the representative group of storage elements 110, such as an ECC operation failure while decoding the read data.

A replacement default read threshold at least partially based on the default read threshold and on the updated read threshold is generated, at 506. For example, the read threshold updater 114 may receive the update read threshold 118 and the default read threshold 116 and perform one or more operations to determine the replacement default read threshold 120. For example, the read threshold updater 114 may generate the replacement default read threshold 120 according to a weighted average of the update read threshold 118 and the default read threshold 116.

The replacement default read threshold is sent to the memory, at 508. After reading the data from the memory using the updated read threshold, a subsequent read of the memory using the replacement default read threshold is performed, at 510. Subsequent reads of data from the memory 104 may be performed using replacement default read thresholds 120 that are generated to converge toward a mean value, such as Vmean of FIG. 2.

Figure 6:
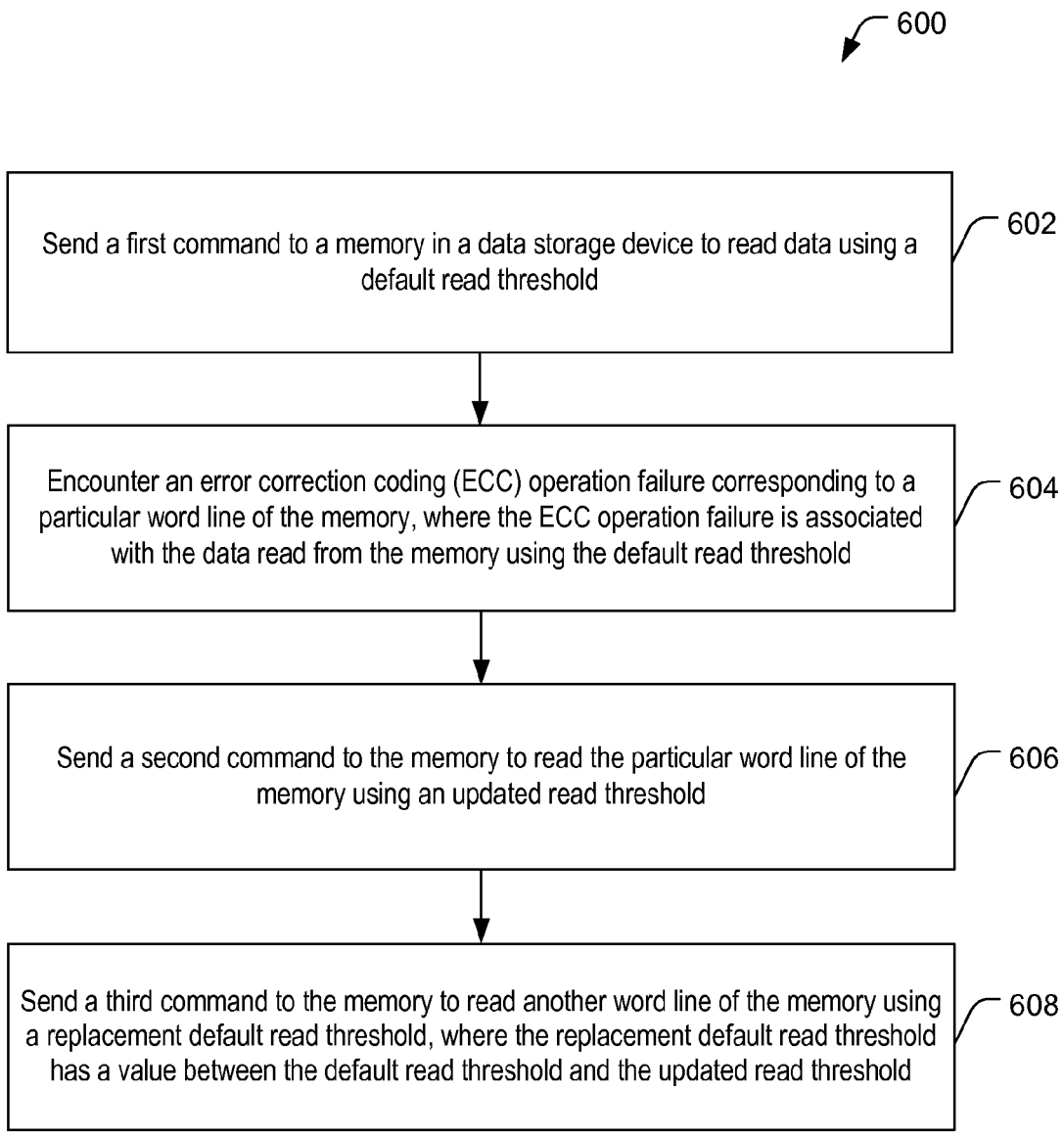
FIG. 6 is a flow diagram illustrating a particular embodiment of a method of reading data from a memory using a default read threshold, an updated read threshold, and a replacement default read threshold.

Referring to FIG. 6, a flowchart that illustrates an embodiment of a method of reading data from a memory using a default read threshold, an updated read threshold, and a replacement default read threshold is depicted and generally designated 600. The method 600 may be performed in a controller of a data storage device. The data storage device may include a memory. For example, the method may be performed in the data storage device 102 of FIG. 1 and FIG. 3.

A first command may be sent to a memory in a data storage device to read data in the memory using a default read threshold, at 602. For example, the controller 106 may send the first command to the memory 104 to read data from a particular word line in the group of storage elements 110 of the memory 104 using the default read threshold 116.

An error correction coding (ECC) operation failure may be encountered corresponding to a particular word line of the memory, where the ECC operation failure is associated with the data read from the memory using the default read threshold, at 604. For example, the ECC engine 330 may detect errors in the read data corresponding to the particular word line in the group of storage elements 110 read using the default read threshold 116. The ECC engine 330 may provide the error indication 332 to the read threshold generator 112 based on decoded data resulting from ECC processing at the ECC engine 330.

A second command may be sent to the memory to read the particular word line of the memory using an updated read threshold, at 606. For example, the controller 106 may send the second command to the memory 104 to read data from the particular word line in the group of storage elements 110 using an update read threshold 118 generated by the read threshold generator 112.

A third command may be sent to the memory to read another word line of the memory using a replacement default read threshold, where the replacement default read threshold has a value between the default read threshold and the updated read threshold, at 608. For example, after reading the particular word line in the group of storage elements 110 using the update read threshold 118, a subsequent read of data from the memory 104 may be performed according to a threshold voltage that may converge to a value that reduces an overall number of errors in data read from the memory 104. To illustrate, another word line in the group of storage elements 110 may be read by a replacement default read threshold 120. The replacement default read threshold 120 may be generated by the read threshold updater 114, which may receive the updated read threshold 118 and the default read threshold 116 and perform one or more operations, such as a weighted average of the update read threshold 118 and the default read threshold 116, to generate the replacement default read threshold 120. The replacement default read threshold 120 may have a value between the default read threshold 116 and the update read threshold 118. Subsequent reads of data from the memory 104 may be performed according to a threshold voltage that may converge to a value that reduces an overall number of errors in data read from the memory 104

Although various components depicted herein are illustrated as block components and described in general terms, such components may include one or more microprocessors, state machines, or other circuits configured to enable a data storage device, such as the data storage device 102 of FIG. 1 and FIG. 3, to perform the particular functions attributed to such components, or any combination thereof For example, the read threshold updater 114 of FIG. 1 and FIG. 3 may represent physical components, such as controllers, processors, state machines, logic circuits, or other structures to generate the replacement read threshold 120.

The read threshold updater 114 may be implemented using a microprocessor or microcontroller programmed to generate the replacement read threshold 120 using, for example, a weighted sum of the default read threshold 116 and the updated read threshold 118. In a particular embodiment, the controller 106 includes a processor executing instructions that are stored at the memory 104. Alternatively, or in addition, executable instructions that are executed by the processor may be stored at a separate memory location that is not part of the memory 104, such as at a read-only memory (ROM) (not shown).

In a particular embodiment, the data storage device 102 may be a portable device configured to be selectively coupled to one or more external devices. However, in other embodiments, the data storage device 102 may be attached or embedded within one or more host devices, such as within a housing of a portable communication device. For example, the data storage device 102 may be within a packaged apparatus, such as a wireless telephone, a personal digital assistant (PDA), a gaming device or console, a portable navigation device, a computer, or other device that uses internal non-volatile memory. In a particular embodiment, the data storage device 102 includes a non-volatile memory, such as a Flash memory (e.g., NAND, NOR, Multi-Level Cell (MLC), Divided bit-line NOR (DINOR), AND, high capacitive coupling ratio (HiCR), asymmetrical contactless transistor (ACT), or other Flash memories), an erasable programmable read-only memory (EPROM), an electrically-erasable programmable read-only memory (EEPROM), a read-only memory (ROM), a one-time programmable memory (OTP), or any other type of memory.

The illustrations of the embodiments described herein are intended to provide a general understanding of the various embodiments. Other embodiments may be utilized and derived from the disclosure, such that structural and logical substitutions and changes may be made without departing from the scope of the disclosure. This disclosure is intended to cover any and all subsequent adaptations or variations of various embodiments.

The above-disclosed subject matter is to be considered illustrative, and not restrictive, and the appended claims are intended to cover all such modifications, enhancements, and other embodiments, which fall within the scope of the present disclosure. Thus, to the maximum extent allowed by law, the scope of the present invention is to be determined by the broadest permissible interpretation of the following claims and their equivalents, and shall not be restricted or limited by the foregoing detailed description.

What is claimed is:

1. A method comprising:
   in a controller of a data storage device, wherein the data storage device includes a memory, performing:
      generating a replacement default read threshold at least partially based on a default read threshold and an updated read threshold; and
      sending the replacement default read threshold to the memory.

2. The method of claim 1, wherein generating the replacement default read threshold includes performing a weighted sum of the updated read threshold and the default read threshold.

3. The method of claim 2, wherein the weighted sum is at least partially based on a count of prior updates to the default read threshold.

4. The method of claim 2, wherein the weighted sum is at least partially based on a moving average, wherein the moving average is based on prior updates to the default read threshold.

5. The method of claim 2, wherein the weighted sum is at least partially based on the updated read threshold scaled by a first scaling factor and the default read threshold scaled by a second scaling factor.

6. The method of claim 5, wherein a sum of the first scaling factor and the second scaling factor equals one.

7. The method of claim 1, wherein the updated read threshold is generated in response to an error correction coding failure of data read from the memory using the default read threshold.

8. The method of claim 1, further comprising:
   reading data from the memory using the default read threshold;
   in response to encountering an error correction coding operation failure associated with the data read from the memory using the default read threshold, reading the data from the memory using the updated read threshold; and
   after reading the data from the memory using the updated read threshold, performing a subsequent read of the memory using the replacement default read threshold.

9. The method of claim 1, wherein the memory includes a flash memory.

10. A method comprising:
    in a controller of a data storage device, wherein the data storage device includes a memory, performing:
       sending a first command to the memory to read data using a default read threshold;
       encountering an error correction coding (ECC) operation failure corresponding to a particular word line of the memory, wherein the ECC operation failure is associated with the data read from the memory using the default read threshold;
       sending a second command to the memory to read the particular word line of the memory using an updated read threshold; and
       sending a third command to the memory to read another word line of the memory using a replacement default read threshold, wherein the replacement default read threshold has a value between the default read threshold and the updated read threshold.

11. The method of claim 10, wherein the replacement default read threshold corresponds to a weighted sum of the updated read threshold and the default read threshold.

12. The method of claim 11, wherein the weighted sum is at least partially based on a count of prior updates to the default read threshold.

13. The method of claim 11, wherein the weighted sum is at least partially based on a moving average, wherein the moving average is based on prior updates to the default read threshold.

14. The method of claim 11, wherein the weighted sum is at least partially based on the updated read threshold scaled by a first scaling factor and the default read threshold scaled by a second scaling factor.

15. A data storage device comprising:
    a memory; and
    a controller configured to:
       generate a replacement default read threshold at least partially based on a default read threshold and on an updated read threshold; and
       send the replacement default read threshold to the memory.

16. The data storage device of claim 15, wherein the controller is configured to perform a weighted sum of the updated read threshold and the default read threshold to generate the replacement default read threshold.

17. The data storage device of claim 16, wherein the weighted sum is at least partially based on a count of prior updates to the default read threshold.

18. The data storage device of claim 16, wherein the weighted sum is at least partially based on a moving average, wherein the moving average is based on prior updates to the default read threshold.

19. The data storage device of claim 16, wherein the weighted sum is at least partially based on the updated read threshold scaled by a first scaling factor and the default read threshold scaled by a second scaling factor.

20. The data storage device of claim 15, further comprising an error correction coding (ECC) engine, wherein the controller is configured to provide data read from the memory to the ECC engine.

21. The data storage device of claim 20, further comprising a read threshold generator configured to generate the updated read threshold in response to an ECC operation failure while decoding the data.

22. A data storage device comprising:
a memory with a plurality of word lines; and
a controller configured to:
 cause the memory to read data using a default read threshold;
 cause the memory to read a particular word line of the memory using an updated read threshold in response to an error correction coding (ECC) operation failure corresponding to the particular word line of the memory, wherein the ECC operation failure is associated with data read from the memory using the default read threshold; and
 cause the memory to read another word line of the memory using a replacement default read threshold, wherein the replacement default read threshold has a value between the default read threshold and the updated read threshold.

23. The data storage device of claim 22, wherein the replacement default read threshold corresponds to a weighted sum of the updated read threshold and the default read threshold.

24. The data storage device of claim 23, wherein the weighted sum is at least partially based on a count of prior updates to the default read threshold.

25. The data storage device of claim 23, wherein the weighted sum is at least partially based on a moving average, wherein the moving average is based on prior updates to the default read threshold.

26. The data storage device of claim 23, wherein the weighted sum is at least partially based on the updated read threshold scaled by a first scaling factor and the default read threshold scaled by a second scaling factor.

\* \* \* \* \*